United States Patent
Tsai et al.

(10) Patent No.: US 9,226,394 B2
(45) Date of Patent: Dec. 29, 2015

(54) TOUCH-SENSING SUBSTRATE, DISPLAY PANEL, AND PATTERNED LIGHT-SHIELDING LAYER

(71) Applicant: UNIDISPLAY INC., Hsinchu County (TW)

(72) Inventors: Yi-Ming Tsai, Taichung (TW); Chun-Heng Lin, Taichung (TW); Wea-Li Tien, Hsinchu (TW); Sheng-Hsien Lin, Tainan (TW); Yueh-Ju Tsai, Taipei (TW); Wei-Jie Wang, Yunlin County (TW)

(73) Assignee: UNIDISPLAY INC., Hsinchu County (TW)

(*) Notice: Subject to any disclaimer, the term of this patent is extended or adjusted under 35 U.S.C. 154(b) by 253 days.

(21) Appl. No.: 13/945,923

(22) Filed: Jul. 19, 2013

(65) Prior Publication Data
US 2014/0022743 A1    Jan. 23, 2014

(30) Foreign Application Priority Data
Jul. 20, 2012   (TW) .............................. 101126329 A

(51) Int. Cl.
| G06F 3/041 | (2006.01) |
| G06F 3/045 | (2006.01) |
| H05K 1/09 | (2006.01) |
| H05K 1/00 | (2006.01) |
| H05K 1/02 | (2006.01) |
| G06F 3/044 | (2006.01) |

(52) U.S. Cl.
CPC .............. *H05K 1/0296* (2013.01); *G06F 3/044* (2013.01); *H05K 1/0289* (2013.01); *G06F 2203/04112* (2013.01); *H05K 2201/09681* (2013.01)

(58) Field of Classification Search
CPC .................................................... H05K 1/0296
USPC ............ 174/257, 258; 345/173, 174; 349/138
See application file for complete search history.

(56) References Cited

U.S. PATENT DOCUMENTS

| 2011/0285641 A1* | 11/2011 | Huang ........................... 345/173 |
| 2011/0315536 A1* | 12/2011 | Chiou et al. .................. 200/600 |
| 2012/0314170 A1* | 12/2012 | Hisada et al. ................. 349/138 |

* cited by examiner

*Primary Examiner* — Timothy Thompson
*Assistant Examiner* — Sherman Ng
(74) *Attorney, Agent, or Firm* — Jianq Chyun IP Office

(57) ABSTRACT

A touch-sensing substrate including a substrate, a patterned conductive layer and a patterned insulating layer is provided. The substrate has a plurality of first striped regions and a plurality of second striped regions. The first striped regions are intersected with the second striped regions to define a plurality of sensing-pad disposition regions. The patterned conductive layer includes a plurality of sensing pads disposed in the sensing-pad disposition regions. The patterned insulating layer is disposed on the first striped regions and the second striped regions. The patterned insulating layer and the patterned conductive layer are spliced to form a patterned light-shielding layer. The patterned light-shielding layer has a plurality of enclosed notches arranged in array, wherein parts of the enclosed notches are surrounded by the patterned conductive layer, and other parts of the enclosed notches are surrounded by the patterned conductive layer and the patterned insulating layer.

16 Claims, 4 Drawing Sheets

TOUCH-SENSING SUBSTRATE, DISPLAY PANEL, AND PATTERNED LIGHT-SHIELDING LAYER

CROSS-REFERENCE TO RELATED APPLICATION

This application claims the priority benefit of Taiwan application serial no. 101126329, filed on Jul. 20, 2012. The entirety of the above-mentioned patent application is hereby incorporated by reference herein and made a part of this specification.

BACKGROUND OF THE INVENTION

1. Field of the Invention

The invention relates to a touch-sensing substrate, and more particularly, to a touch-sensing circuit fabrication integrated in a touch-sensing substrate of a patterned light-shielding fabrication.

2. Description of Related Art

In order for electronic products to further conform to the user-friendly requirement, many electronic products such as auto-tell machine (ATM), mobile phone, tablet personal computer (PC) etc., mostly have a touch-sensing panel built-in to allow the user to operate more conveniently. In general, touch-sensing panels on the whole may be divided into resistive, capacitive, infra-red and ultrasonic etc. touch-sensing panels, wherein the resistive and the capacitive touch-sensing panels are the most commonly seen products.

For example, the capacitive touch-sensing panel is sensed and determined the location touched by the user via the sensing circuit containing a X-sensing series and a Y-sensing series. In a conventional capacitive touch-sensing panel, the X-sensing series and the Y-sensing series are mostly utilized indium tin oxide or other transparent conductive materials to fabricate. Although there is a good light transmittance between the X-sensing series and the Y-sensing series fabricated from the transparent conductive materials, the user is still capable of noticing the profiles of the X-sensing series and the Y-sensing series during using the capacitive touch-sensing panel. Therefore, designing a X-sensing series and a Y-sensing series without easily being noticed by the user is becoming one of issues that the researchers are intended to solve. Under such developing trend, many conventional techniques have been successively proposed, but these conventional techniques are only capable of reducing the probability of the X-sensing series and the Y-sensing series being noticed by the user, and are not capable of avoiding the X-sensing series and the Y-sensing series being noticed by the user completely.

SUMMARY OF THE INVENTION

The invention is directed to a touch-sensing substrate, which simultaneously has the light-shielding and touch-sensing functions.

The invention is further directed to a display panel. The display panel includes the aforementioned touch-sensing substrate, and a patterned conductive layer receiving a touch-sensing signal in the display panel is not easily been detected by human eyes.

The invention is also directed to a patterned light-shielding layer, which simultaneously has the light-shielding and touch-sensing functions.

The invention provides a touch-sensing substrate. The touch-sensing substrate includes a substrate, a patterned conductive layer and a patterned insulating layer. The substrate has a surface, wherein the substrate has a plurality of first striped regions parallel to each other and a plurality of second striped regions parallel to each other, the first striped regions are intersected with the second striped regions to define a plurality of sensing-pad disposition regions, and the first striped regions and the second striped regions are located on the surface. The patterned conductive layer is disposed on the surface, wherein the patterned conductive layer includes a plurality of mesh-shaped sensing pads disposed on the sensing-pad disposition regions. The patterned insulating layer is disposed on the first striped regions and the second striped regions, wherein the patterned insulating layer and the patterned conductive layer are spliced to form a patterned light-shielding layer. The patterned light-shielding layer has a plurality of enclosed notches arranged in array, wherein parts of the enclosed notches are surrounded by the patterned conductive layer, and other parts of the enclosed notches are surrounded by the patterned conductive layer and the patterned insulating layer disposed on the first striped regions or the second striped regions.

The invention provides a display panel. The display panel includes the aforementioned touch-sensing substrate, an active device array substrate and a display medium layer. The active device array substrate is opposite to the touch-sensing substrate. The active device array substrate has a plurality of display regions arranged in array and a non-display region located outside the display regions, wherein a location of the patterned light-shielding layer is corresponded to a location of the non-display region, and an edge of the non-display region is not exceeded an edge of the patterned light-shielding layer. The display medium layer is disposed between the active device array substrate and the touch-sensing substrate.

The invention provides a patterned light-shielding layer. The patterned light-shielding layer is adapted to be disposed on the surface of the substrate. The patterned light-shielding layer includes a patterned conductive layer and a patterned insulating layer. The patterned conductive layer is disposed on the surface of the substrate, wherein the patterned conductive layer includes a plurality of mesh-shaped sensing pads disposed on the sensing-pad disposition regions. The patterned insulating layer is disposed on the first striped regions and the second striped regions, wherein the patterned insulating layer and the patterned conductive layer are spliced to form a patterned light-shielding layer. The patterned light-shielding layer has a plurality of enclosed notches, wherein parts of the enclosed notches are surrounded by the patterned conductive layer, and other parts of the enclosed notches are surrounded by the patterned conductive layer and the patterned insulating layer disposed on the first striped regions or the second striped regions.

In various embodiments of the invention, the fabrication of touch-sensing circuit is integrated in the fabrication of patterned light-shielding layer, therefore, the user is not capable of distinguishing the touch-sensing circuit and the patterned light-shielding layer, and thus the touch-sensing substrate and the display panel of the invention have the favourable visual effect.

In order to make the features and advantages of the present invention more comprehensible, the present invention is further described in detail in the following with reference to the embodiments and the accompanying drawings.

BRIEF DESCRIPTION OF THE DRAWINGS

The accompanying drawings are included to provide a further understanding of the invention, and are incorporated

DESCRIPTION OF THE EMBODIMENTS

First Embodiment

Figure 1:
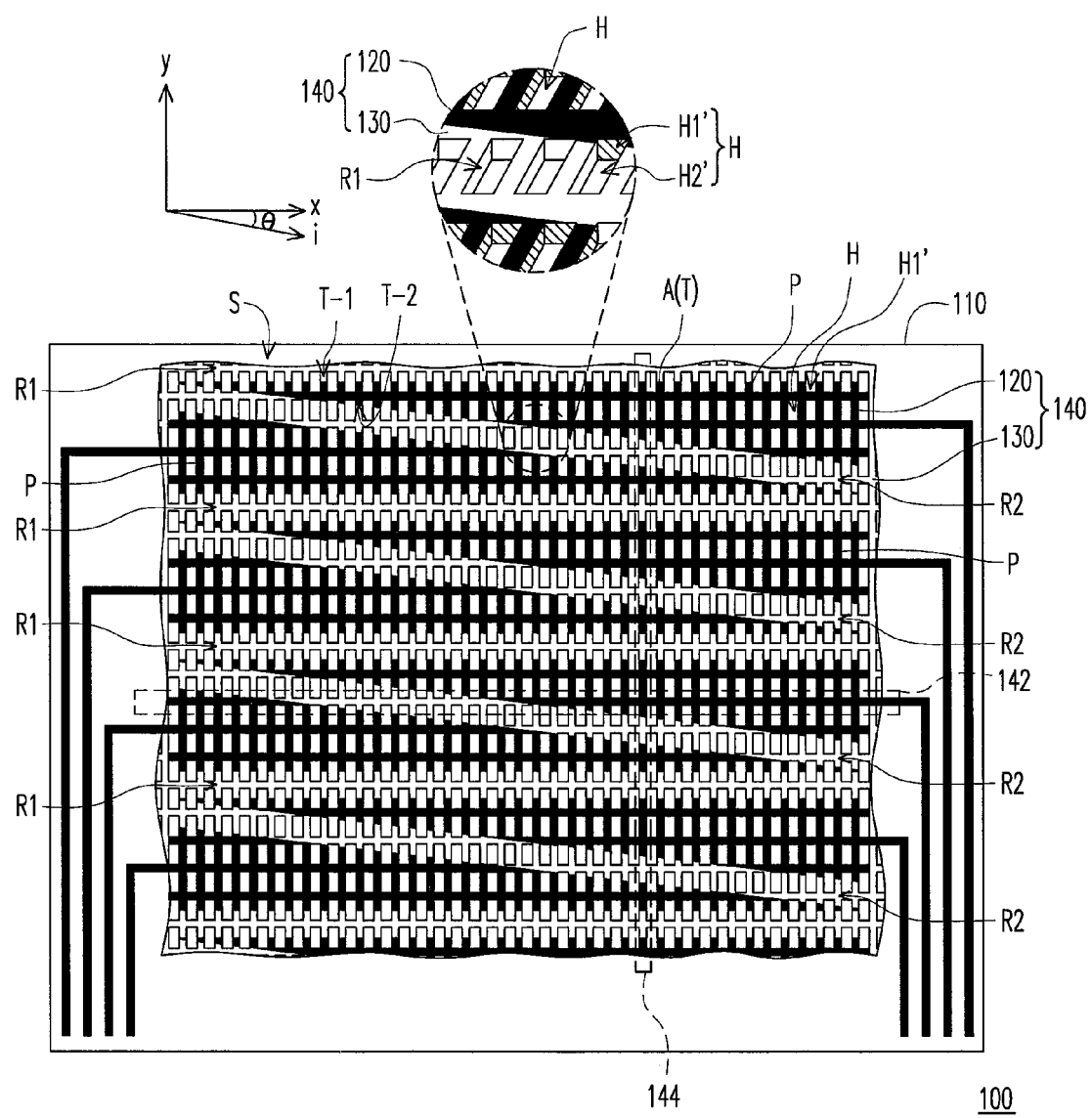
FIG. 1 is a schematic diagram illustrating a touch-sensing substrate according to a first embodiment of the invention.

FIG. 1 is a schematic diagram illustrating a touch-sensing substrate 100 according to an embodiment of the invention. The touch-sensing substrate 100 of this embodiment may include a substrate 110, a patterned conductive layer 120 and a patterned insulating layer 130. The substrate 110 has a surface S, wherein the substrate 110 has a plurality of first striped regions R1 parallel to each other and a plurality of second striped regions R2 parallel to each other. The first striped regions R1 are intersected with the second striped regions R2 to define a plurality of sensing-pad disposition regions A, and the first striped regions R1 and the second striped regions R2 are located on the surface S.

For example, the first striped regions R1 are the striped regions extending along the x-axis direction, and a length of the first striped regions R1 on the x-axis direction is close to a length of the substrate 110 on the x-axis direction. The second striped regions R2 are the striped regions extending along the i-axis direction included an acute angle θ with the x-axis direction, and a length of the second striped regions R2 on the i-axis direction is, such as, the length of the first striped regions R1 on the x-axis direction multiplied with cos θ, wherein the first striped regions R1 and the adjacent second striped regions R2 define the sensing-pad disposition regions A. In details, a shape of the sensing-pad disposition regions A is, such as, a right-angled triangle T. A long side T–1 of the right-angled triangle T is parallel to the x-axis direction, and a length of the long side T–1 is close to the length of the first striped regions R1 on the x-axis direction. A hypotenuse side T–2 of the right-angled triangle T is parallel to the i-axis direction, and a length of the hypotenuse side T–2 is close to the length of the second striped regions R2 on the i-axis direction. The long side T–1 and the hypotenuse side T–2 are included an acute angle θ. However, the invention is not limited to the exemplary embodiments. In other embodiments, the shape of the sensing-pad disposition regions A may also be polygon. In this embodiment, the substrate 110 may be a glass substrate, a plastic substrate, a printed circuit board or a display panel. A material of the substrate 110 may be glass, quartz, organic polymer, or an opaque/reflective material (such as a conductive material, a wafer, a ceramic or other suitable materials), or other suitable materials.

The patterned conductive layer 120 is disposed on the surface S, wherein the patterned conductive layer 120 may include a plurality of mesh-shaped sensing pads P disposed on the sensing-pad disposition regions A, and the mesh-shaped sensing pads P are electrically insulated from each other. The mesh-shaped sensing pads P are adapted to sense the external touch signals to position the touch location. It should be noted that, the mesh-shaped sensing pads P are not the intact sensing pads. The mesh-shaped sensing pads P may have a plurality of enclosed notches H and a plurality of open notches H1'. In other words, the patterned conductive layer 120 having the plurality of enclosed notches H with fine structures and the plurality of open notches H1', which is not easily been noticed by human eyes. In this embodiment, the patterned conductive layer 120, other than has the function of receiving sensing signals, also has the function of light-shielding simultaneously. Therefore, the material selection of the patterned conductive layer 120 is preferably the material having good light-shielding and conductivity, for example, metal material such as metal chromium (Cr), chromium oxide (CrOx) etc.

The patterned insulating layer 130 is disposed on the first striped regions R1 and the second striped regions R2, wherein the patterned insulating layer 130 and the patterned conductive layer 120 are spliced to form a patterned light-shielding layer 140. The patterned light-shielding layer 140 has the plurality of enclosed notches H, wherein the parts of the enclosed notches H are surrounded by the patterned conductive layer 120, and other parts of the enclosed notches H are surrounded by the patterned conductive layer 120 and the patterned insulating layer 130 disposed on the first striped regions R1 or the second striped regions R2.

In other words, the patterned insulating layer 130 is not an intact insulating layer. The patterned insulating layer 130 may have a plurality of open notches H2'. Certainly, the patterned insulating layer 130 may also have the plurality of enclosed notches H. It should be noted that, the open notches H2' located on the first striped regions R1 or the second striped regions R2 are respectively connected to the open notches H1' in the adjacent patterned conductive layer 120, so as to be spliced to form the enclosed notches H. To be specific, since the patterned light-shielding layer 140 formed by splicing the patterned conductive layer 120 and the patterned insulating layer 130 with the light-shielding function is, such as, a mesh-shaped light-shielding layer having the plurality of enclosed notches H arranged in array. The patterned light-shielding layer 140 may include a plurality of first portions 142 parallel to the x-axis direction and a plurality of second portions 144 parallel to the y-axis direction. The first portions 142 (or the second portions 144) are, such as, a long strip pattern formed by alternately connecting parts of the patterned conductive layer 120 and parts of the patterned insulating layer 130. In this embodiment, the patterned insulating layer 130 also has the light-shielding function, other than capable of turning each mesh-shaped sensing pad P disposed on the sensing-pad disposition regions A to be electrically insulated from each other. Therefore, the material selection of the patterned insulating layer 130 is preferably the material having good insulation and light-shielding. The material of the patterned insulating layer 130 may be a black insulating material such as black resin or other suitable insulating and light-shielding materials.

Moreover, it should be noted that, the size of the plurality of enclosed notches H in the patterned light-shielding layer 140 may be identical or different. In details, the shape, size and disposition manner thereof may all depend on the actual design requirement to be adjusted appropriately.

Figure 2:
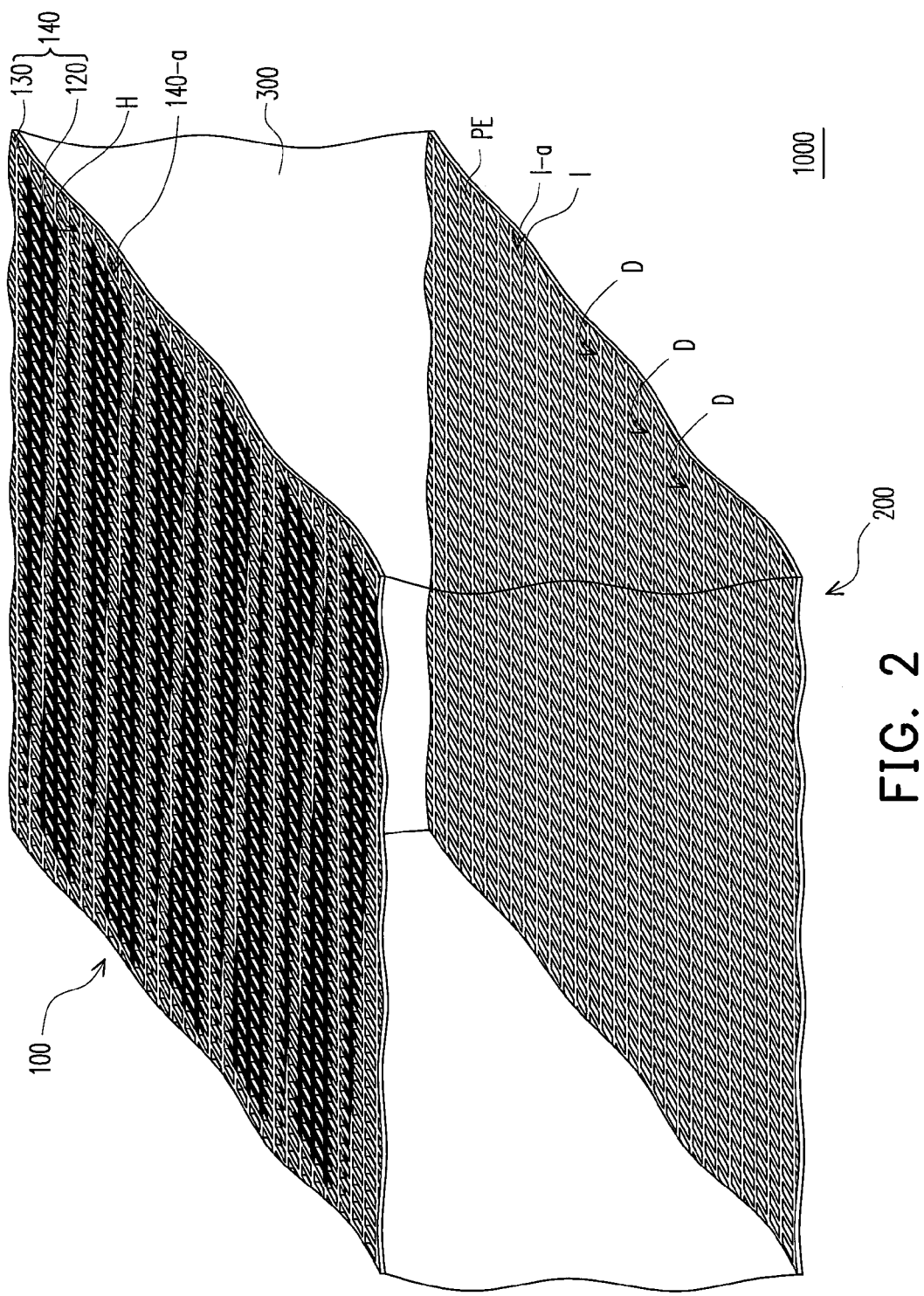
FIG. 2 is a schematic diagram illustrating a display panel according to a first embodiment of the invention.

FIG. 2 is a schematic diagram illustrating a display panel 1000 according to an embodiment of the invention. The display panel 1000 of the embodiment may include the touch-sensing substrate 100 of the embodiment, an active device array substrate 200 and a display medium layer 300. The active device array substrate 200 is opposite to the touch-sensing substrate 100. The display medium layer 300 is disposed between the active device array substrate 200 and the touch-sensing substrate 100.

It should be noted that, the active device array substrate 200 has a plurality of display regions D arranged in array and a non-display region I located outside these display regions, wherein a location of the patterned light-shielding layer 140 is corresponded to a location of the non-display region I, and an edge I-a of the non-display region I is not exceeded an edge 140-a of the patterned light-shielding layer 140. In other words, the patterned light-shielding layer 140 may completely cover the non-display region I of the active device array substrate 200 and expose the display regions D of the active device array substrate 200. That is to say, the touch-sensing substrate 100 including the patterned light-shielding layer 140 has the same function as the black matrix, and concurrently has the sensing touch location function. Moreover, the patterned light-shielding layer 140 (including the patterned conductive layer 120 and the patterned insulating layer 130) with the similar function as the black matrix, which the structure thereof is meticulous and not being noticed easily by human eyes. It should be noted that, the size and shape of the enclosed notches H are, for example, corresponded with the sub-pixels PE (or the pixel) on the active device array substrate 200.

Second Embodiment

Figure 3:
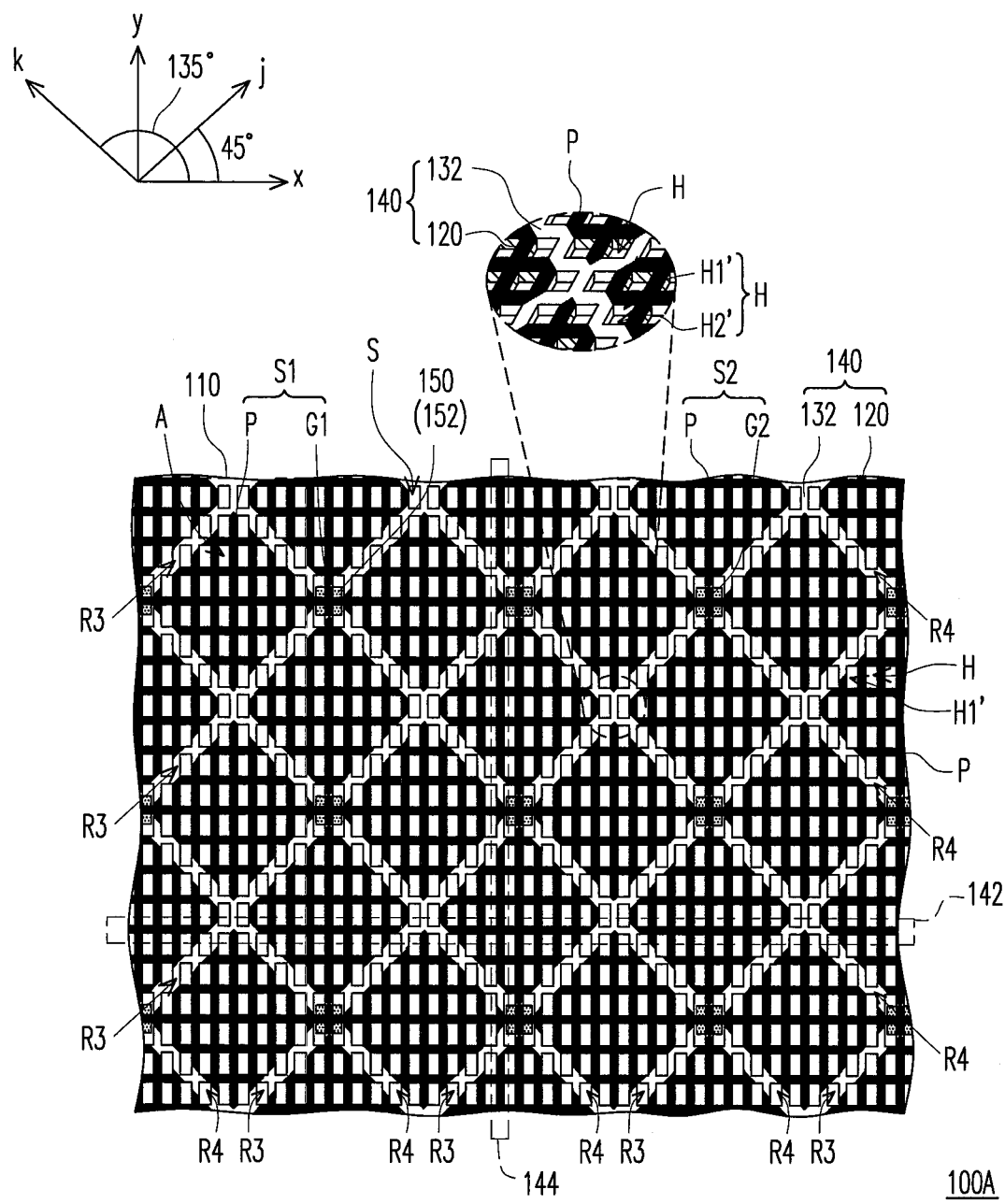
FIG. 3 is a schematic diagram illustrating a touch-sensing substrate according to a second embodiment of the invention.

FIG. 3 is a schematic diagram illustrating a touch-sensing substrate 100A according to a second embodiment of the invention. The touch-sensing substrate 100A of the embodiment may include a substrate 110, a patterned conductive layer 120 and a first patterned insulating layer 132. The substrate 110 has a surface S, wherein the substrate 110 has a plurality of third striped regions R3 parallel to each other and a plurality of fourth striped regions R4 parallel to each other. The third striped regions R3 are intersected with the fourth striped regions R4 to define a plurality of sensing-pad disposition regions A, and the third striped regions R3 and the fourth striped regions R4 are located on the surface S.

For example, the third striped regions R3 are the striped regions extending along the j-axis direction included an angle of 45° with the x-axis direction, and the fourth striped regions R4 are the striped regions extending along the k-axis direction included an angle of 135° with the x-axis direction. The third striped regions R3 and the fourth striped region R4 define the plurality of sensing-pad disposition regions A. In this embodiment, the shape of these sensing-pad disposition regions A is, for example, rhombus.

The patterned conductive layer 120 is disposed on the surface S, wherein the patterned conductive layer 120 includes a plurality of mesh-shaped sensing pads P disposed on the sensing-pad disposition regions A and a plurality of first bridging wires G1 connected to the parts of the mesh-shaped sensing pads P. In other words, the parts of the mesh-shaped sensing pads P arranged along the x-axis direction are electrically connected via the plurality of first bridging wires G1 to constitute first sensing series S1 extending along the x-axis direction, and other parts of the mesh-shaped sensing pads P are electrically insulated from the first sensing series S1. It should be noted that, the mesh-shaped sensing pads P are not intact sensing pads. In other words, the mesh-shaped sensing pads P may have a plurality of enclosed notches H and a plurality of open notches H1'.

The first patterned insulating layer 132 is disposed on the third striped regions R3 and the fourth striped regions R4, wherein the first patterned insulating layer 132 and the patterned conductive layer 120 are connected to each other to splice a patterned light-shielding layer 140. The patterned light-shielding layer 140 has a plurality of enclosed notches H, wherein parts of the enclosed notches H are surrounded by the patterned conductive layer 120, and other parts of the enclosed notches H are surrounded by the patterned conductive layer 120 and the first patterned insulating layer 132 disposed on the third striped regions R3 or the fourth striped regions R4.

In other words, the first patterned insulating layer 132 is not an intact insulating layer, and the first patterned insulating layer 132 may have a plurality of open notches H2'. Certainly, the patterned insulating layer 132 may also have the plurality of enclosed notches H. It should be noted that, the open notches H2' located on the third striped regions R3 or the fourth striped regions R4 are respectively connected to the open notches H1' in the adjacent patterned conductive layer 120, so as to be spliced to form the enclosed notches H. To be specific, since the patterned light-shielding layer 140 formed by splicing the patterned conductive layer 120 and the patterned insulating layer 130 is, such as, a mesh-shaped light-shielding layer having the plurality of enclosed notches H arranged in array. The patterned light-shielding layer 140 may include a plurality of first portions 142 parallel to the x-axis direction and a plurality of second portions 144 parallel to the y-axis direction. The first portions 142 (or the second portions 144) are, such as, a long strip pattern formed by alternately connecting parts of the patterned conductive layer 120 and parts of the patterned insulating layer 130.

The touch-sensing substrate 100A of the embodiment may further include a second patterned insulating layer 150. The second patterned insulating layer 150 is disposed on the patterned conductive layer 120 and at least covers the first bridging wires G1. To be specific, the second patterned insulating layer 150 may include a plurality of island-shaped insulating blocks 152 covering each of the first bridging wires G1 respectively. These island-shaped insulating blocks 152 preferably are coincided with the first bridging wires G1 beneath thereof. The material of these island-shaped insulating blocks 152 may be a transparent insulating material or a light-shielding insulating material, such as silicon nitride (SiNx) or metal chromium (Cr).

Moreover, the touch-sensing substrate 100A of the embodiment further includes a plurality of second bridging wires G2. These second bridging wires G2 are disposed on the second patterned insulating layer 150 and electrically connected to parts of the mesh-shaped sensing pads P. In details, the parts of the mesh-shaped sensing pads P arranged along the y-axis direction are electrically connected via the plurality of second bridging wires G2 to constitute second sensing series S2 extending along the y-axis direction. The first sensing series S1 and the second sensing series S2 are electrically insulated from each other.

Figure 4:
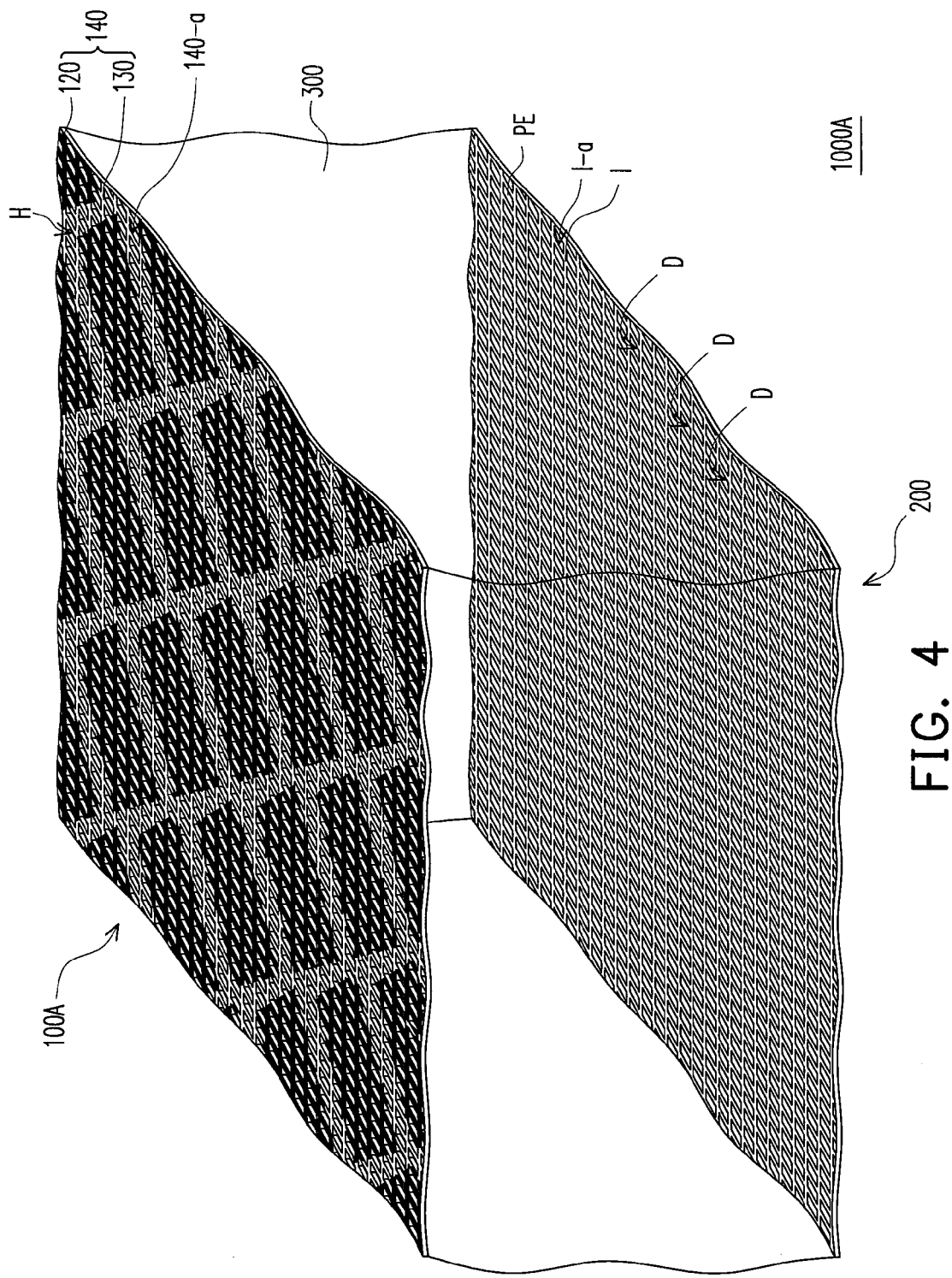
FIG. 4 is a schematic diagram illustrating a display panel according to a second embodiment of the invention.

FIG. 4 is a schematic diagram illustrating a display panel 1000A according to an embodiment of the invention. The display panel 1000A of the embodiment may include the touch-sensing substrate 100A of the embodiment, an active device array substrate 200 and a display medium layer 300. The active device array substrate 200 is opposite to the touch-sensing substrate 100A. The display medium layer 300 is disposed between the active device array substrate 200 and the touch-sensing substrate 100A.

It should be noted that, the active device array substrate 200 has a plurality of display regions D arranged in array and a non-display region I located outside these display regions D, wherein a location of the patterned light-shielding layer 140 is corresponded to a location of the non-display region I, and an edge I-a of the non-display region I is not exceeded an edge 140-a of the patterned light-shielding layer 140. In other words, the patterned light-shielding layer 140 may completely cover the non-display region I of the active device array substrate 200 and expose the display regions D of the active device array substrate 200. That is to say, the touch-sensing substrate 100A including the patterned light-shielding layer 140 has the similar function as the black matrix, and concurrently has the sensing touch location function. Moreover, the patterned light-shielding layer 140 with the similar function as the black matrix, which the structure thereof is meticulous and not being noticed easily by human eyes. It should be noted that, the size and shape of the enclosed notches H are, for example, corresponded with the sub-pixels PE (or the pixel) on the active device array substrate 200.

In summary, the touch-sensing substrate of the invention, by integrating the patterned conductive layer with the sensing function into the patterned light-shielding layer, so that the sensing touch substrate of the invention also has the sensing touch location function, other than has the light-shielding function. In addition, the structure of the patterned conductive layer having the sensing function in the touch-sensing substrate is meticulous and not being noticed easily by human eyes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A touch-sensing substrate, comprising:
   a substrate, having a surface, wherein the substrate has a plurality of first striped regions parallel to each other and a plurality of second striped regions parallel to each other, the first striped regions are intersected with the second striped regions to define a plurality of sensing-pad disposition regions, and the first striped regions and the second striped regions are located on the surface;
   a patterned conductive layer, disposed on the surface, wherein the patterned conductive layer comprises a plurality of mesh-shaped sensing pads disposed on the sensing-pad disposition regions; and
   a patterned insulating layer, disposed on the first striped regions and the second striped regions, wherein the patterned insulating layer and the patterned conductive layer are spliced to form a patterned light-shielding layer, the patterned light-shielding layer has a plurality of enclosed notches arranged in array, wherein parts of the enclosed notches are surrounded by the patterned conductive layer, and other parts of the enclosed notches are surrounded by the patterned conductive layer and the patterned insulating layer disposed on the first striped regions or the second striped regions.

2. The touch-sensing substrate as claimed in claim 1, wherein a material of the patterned insulating layer comprises a black insulating material.

3. The touch-sensing substrate as claimed in claim 1, wherein a material of the patterned insulating layer comprises black resin.

4. The touch-sensing substrate as claimed in claim 1, wherein a material of the patterned conductive layer comprises a metal.

5. The touch-sensing substrate as claimed in claim 1, wherein the patterned conductive layer further comprises a plurality of first bridging wires connected to the parts of the mesh-shaped sensing pads.

6. The touch-sensing substrate as claimed in claim 5, further comprises a second patterned insulating layer disposed on the patterned conductive layer and at least covering the first bridging wire.

7. The touch-sensing substrate as claimed in claim 6, further comprises a plurality of second bridging wires disposed on the second patterned insulating layer and electrically connected to a part of the mesh-shaped sensing pads.

8. The touch-sensing substrate as claimed in claim 5, wherein a material of the patterned insulating layer comprises a black insulating material.

9. The touch-sensing substrate as claimed in claim 5, wherein a material of the patterned insulating layer comprises black resin.

10. The touch-sensing substrate as claimed in claim 5, wherein a material of the patterned conductive layer comprises a metal.

11. A display panel, comprising:
    the touch-sensing substrate as claimed in claim 1;
    an active device array substrate, disposed opposite to the touch-sensing substrate, the active device array substrate has a plurality of display regions arranged in array and a non-display region located outside the display regions, wherein a location of the patterned light-shielding layer is corresponded to a location of the non-display region, and an edge of the non-display region is not exceeded an edge of the patterned light-shielding layer; and
    a display medium layer, disposed between the active device array substrate and the touch-sensing substrate.

12. A display panel, comprising:
    the touch-sensing substrate as claimed in claim 5;
    an active device array substrate, disposed opposite to the touch-sensing substrate, the active device array substrate has a plurality of display regions arranged in array and a non-display region located outside the display regions, wherein a location of the patterned light-shielding layer is corresponded to a location of the non-display region, and an edge of the non-display region is not exceeded an edge of the patterned light-shielding layer; and
    a display medium layer, disposed between the active device array substrate and the touch-sensing substrate.

13. A patterned light-shielding layer, adapted to be disposed on a surface of a substrate, wherein the substrate has a plurality of first striped regions parallel to each other and a plurality of second striped regions parallel to each other, the first striped regions are intersected with the second striped regions to define a plurality of sensing-pad disposition regions, and the first striped regions and the second striped regions are located on the surface, the patterned light-shielding layer comprises:
    a patterned conductive layer, disposed on the surface of the substrate, wherein the patterned conductive layer comprises a plurality of mesh-shaped sensing pads disposed on the sensing-pad disposition regions; and
    a patterned insulating layer, disposed on the first striped regions and the second striped regions, wherein the patterned insulating layer and the patterned conductive layer are spliced to form the patterned light-shielding layer, the patterned light-shielding layer has a plurality of enclosed notches arranged in array, wherein parts of the enclosed notches are surrounded by the patterned conductive layer, and other parts of the enclosed notches are surrounded by the patterned conductive layer and the patterned insulating layer disposed on the first striped regions or the second striped regions.

14. The patterned light-shielding layer as claimed in claim 13, wherein the patterned conductive layer further comprises a plurality of first bridging wires connected to the parts of the mesh-shaped sensing pads.

15. The patterned light-shielding layer as claimed in claim 14, further comprises a second patterned insulating layer disposed on the patterned conductive layer and at least covering the first bridging wire.

16. The patterned light-shielding layer as claimed in claim 15, further comprises a plurality of second bridging wires disposed on the second patterned insulating layer and electrically connected to parts of the mesh-shaped sensing pads.

* * * * *